United States Patent
Miura

(12) 
(10) Patent No.: US 11,028,814 B2
(45) Date of Patent: Jun. 8, 2021

(54) SEMICONDUCTOR DEVICE FOR INTERNAL COMBUSTION ENGINE IGNITION

(71) Applicant: Fuji Electric Co., Ltd., Kanagawa (JP)

(72) Inventor: Hideki Miura, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 296 days.

(21) Appl. No.: 15/973,982

(22) Filed: May 8, 2018

(65) Prior Publication Data

US 2019/0003441 A1 Jan. 3, 2019

(30) Foreign Application Priority Data

Jun. 30, 2017 (JP) .............................. JP2017-128136

(51) Int. Cl.
*F02P 3/055* (2006.01)
*H01T 15/00* (2006.01)
(Continued)

(52) U.S. Cl.
CPC .............. *F02P 3/0554* (2013.01); *F02P 3/051* (2013.01); *H01F 38/12* (2013.01); *H01T 15/00* (2013.01);
(Continued)

(58) Field of Classification Search
CPC ........ F02P 3/0554; F02P 3/051; F02P 3/0552; F02P 9/007; H01F 38/12; H01T 15/00; H03K 2017/0806; H03K 17/0828
See application file for complete search history.

(56) References Cited

U.S. PATENT DOCUMENTS 5,970,964 A * 10/1999 Furuhata ............... F02P 3/0552
  123/644
6,268,682 B1 * 7/2001 Audren ............... H01L 41/0993
  310/328
(Continued)

FOREIGN PATENT DOCUMENTS

CN        1423729 A      6/2003
JP    2005-33611 A       2/2005
(Continued)

OTHER PUBLICATIONS

Japanese Office Action dated Mar. 30, 2021 in a counterpart Japanese patent application No. 2017-128136. (A machine translation (not reviewed for accuracy) attached.).

(Continued)

*Primary Examiner* — Kyle J Moody
*Assistant Examiner* — Jye-June Lee
(74) *Attorney, Agent, or Firm* — Chen Yoshimura LLP

(57) ABSTRACT

A semiconductor device for internal combustion engine ignition includes: a power semiconductor switching device that switches ON and OFF in accordance with a control signal provided by an external control circuit for causing a spark plug to produce sparks via an ignition coil and an external power source; an auxiliary voltage circuit that generates and applies an auxiliary voltage responsive to a collector voltage of the power semiconductor switching device to the gate of the power semiconductor switching device; and a constant current circuit that regulates current from the auxiliary voltage circuit to the gate of the power semiconductor switching device when a high-voltage surge originating from the external power source is applied to the auxiliary voltage circuit via a primary winding of the ignition coil.

7 Claims, 6 Drawing Sheets

(51) Int. Cl.
   *H01F 38/12* (2006.01)
   *H03K 17/082* (2006.01)
   *F02P 3/05* (2006.01)
   *H03K 17/08* (2006.01)
   *F02P 9/00* (2006.01)

(52) U.S. Cl.
   CPC ........ *H03K 17/0828* (2013.01); *F02P 3/0552* (2013.01); *F02P 9/007* (2013.01); *H03K 2017/0806* (2013.01)

(56) References Cited

U.S. PATENT DOCUMENTS

| | | | |
|---|---|---|---|
| 6,336,448 B1 * | 1/2002 | Furuhata | F02P 3/053 |
| | | | 123/644 |
| 6,595,194 B1 | 7/2003 | Ito et al. | |
| 2013/0241609 A1 * | 9/2013 | Miyazawa | H03K 3/57 |
| | | | 327/142 |
| 2014/0015005 A1 * | 1/2014 | Ishii | F02P 3/05 |
| | | | 257/139 |
| 2018/0097514 A1 * | 4/2018 | Ishii | H01F 38/12 |

FOREIGN PATENT DOCUMENTS

| | | |
|---|---|---|
| JP | 3917865 B2 | 5/2007 |
| JP | 2008-192738 A | 8/2008 |
| JP | 2014-013797 A | 1/2014 |
| JP | 2015-005866 A | 1/2015 |
| JP | 2016-149632 A | 8/2016 |

OTHER PUBLICATIONS

Chinese Office Action dated Mar. 19, 2021 in a counterpart Chinese patent application No. 201810447969.1.

* cited by examiner

SEMICONDUCTOR DEVICE FOR INTERNAL COMBUSTION ENGINE IGNITION

BACKGROUND OF THE INVENTION

Technical Field

The present invention relates to a semiconductor device for igniting an internal combustion engine in an automobile or the like, and more particularly to a semiconductor device in which a power semiconductor switching device is switched ON and OFF to produce sparks between electrodes of a spark plug.

Background Art

In previous years, the most common types of ignition schemes for internal combustion engines in automobiles and the like were distributor schemes in which electricity is distributed to the spark plugs in each cylinder using a mechanical mechanism. However, in recent years, direct ignition schemes in which an ignition coil and a power semiconductor switching device are provided for each spark plug and ignition timing is adjusted in accordance with the ignition timings of each cylinder have become the predominant type of ignition scheme. These types of direct ignition schemes utilize semiconductor device ignition modules known as igniters. Patent Documents 1 and 2, for example, disclose technologies for driving power semiconductor switching devices in such igniters. Moreover, Patent Document 3, for example, discloses a technology for use in driver circuits for driving power semiconductor switching devices; this technology aims at reducing the effects of resonance while also reducing power loss at the time of driving.

RELATED ART DOCUMENTS

Patent Documents

Patent Document 1: Japanese Patent Application Laid-Open Publication No. 2008-192738
Patent Document 2: Japanese Patent Application Laid-Open Publication No. 2015-005866
Patent Document 3: Japanese Patent Application Laid-Open Publication No. 2016-149632

SUMMARY OF THE INVENTION

In igniters of the type described above, if the power semiconductor switching devices get damaged, it becomes difficult for the automobile or the like to continue running, and therefore there is demand for technologies for protecting these power semiconductor switching devices. One conceivable example of a situation in which the power semiconductor switching devices could get damaged is when, while a power generator is charging a DC power source such as an automotive battery, a high-voltage/time-constant surge occurs due to the terminals on the DC power source side getting disconnected for some reason, thereby causing an overcurrent resulting from this high-voltage surge to flow to the gates of the power semiconductor switching devices.

Therefore, the present invention was made in light of the foregoing and aims to provide a semiconductor device for internal combustion engine ignition which makes it possible to prevent overcurrent caused by high-voltage/time-constant surges that occur in a power source side such as an automotive battery from flowing to the gate of a power semiconductor switching device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device for internal combustion engine ignition, including: a power semiconductor switching device that switches ON and OFF in accordance with a control signal provided by an external control circuit for causing a spark plug to produce sparks, the power semiconductor switching device including an collector to which a primary winding of an ignition coil is to be connected and a gate to which the control signal is to be inputted; an auxiliary voltage circuit that generates and applies an auxiliary voltage responsive to a collector voltage of the power semiconductor switching device to the gate of the power semiconductor switching device; and a constant current circuit that is interposed between the auxiliary voltage circuit and the gate of the power semiconductor switching device and that limits current flowing from the auxiliary voltage circuit to the gate of the power semiconductor switching device so as to regulate the current even if a high-voltage surge originating from an external power source connected to the primary winding is applied to the auxiliary voltage circuit via the primary winding.

The auxiliary voltage circuit is a circuit that applies a voltage produced by the auxiliary voltage circuit in accordance with the collector voltage of the power semiconductor switching device to the gate of the power semiconductor switching device in order to reduce oscillation caused by the switching operation of the power semiconductor switching device. The constant current circuit that limits the amount of current is arranged on the current path going from this auxiliary voltage circuit to the gate of the power semiconductor switching device so that even when a high-voltage/time-constant surge occurs on the power source side, it is possible to prevent the auxiliary voltage from the auxiliary voltage circuit onto which that surge voltage is superimposed from being applied to the gate of the power semiconductor switching device, thereby ultimately making it possible to prevent damage to the power semiconductor switching device.

The present invention makes it possible to prevent overcurrent caused by high-voltage/time-constant surges that occur in a power source side such as an automotive battery from flowing to the gate of a power semiconductor switching device.

It is to be understood that both the foregoing general description and the following detailed description are exemplary and explanatory, and are intended to provide further explanation of the invention as claimed.

DETAILED DESCRIPTION OF EMBODIMENTS

Next, an embodiment of the present invention will be described in detail with reference to the attached drawings.

(Overall Configuration)

First, the overall configuration of a semiconductor device for internal combustion engine ignition according to an embodiment of the present invention will be described in detail with reference to FIG. 1. One example of characterizing features of this semiconductor device is the inclusion of a constant current circuit (described below) between an auxiliary voltage circuit and the gate of a power semiconductor switching device.

Figure 1:
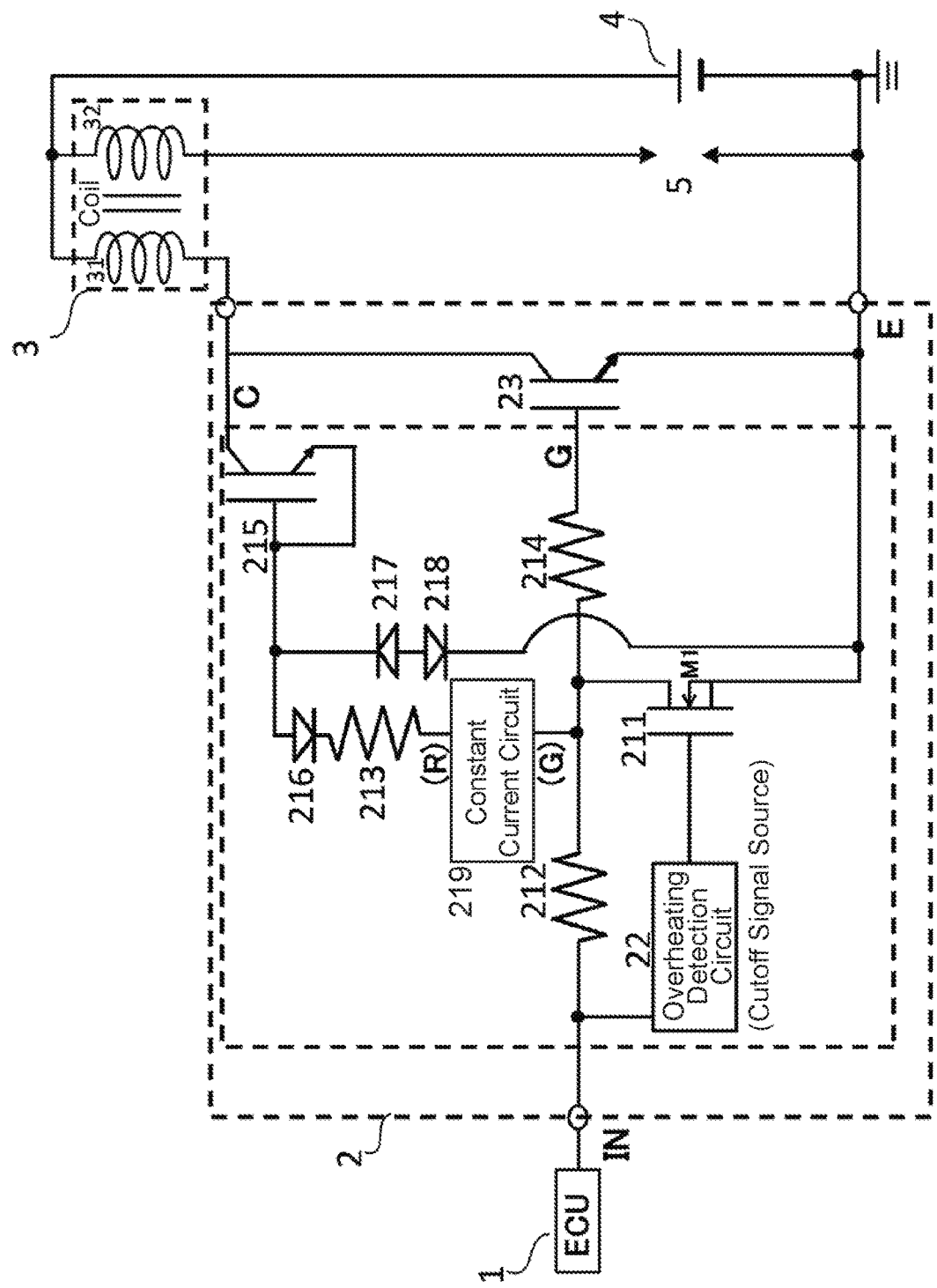
FIG. 1 is a circuit diagram illustrating a semiconductor device for internal combustion engine ignition according to an embodiment of the present invention.

As illustrated in FIG. 1, this semiconductor device 2 is a so-called one-chip igniter, for example, which is applied to an ignition system of an internal combustion engine for an automobile or the like. Such ignition system includes an electronic control unit (ECU; also known as a control circuit) 1, an ignition coil 3, a battery (also known as a power source) 4, and a spark plug 5. The semiconductor device 2 is used to produce sparks between the electrodes of the spark plug 5 of the internal combustion engine for an automobile or the like. The semiconductor device 2 includes a power semiconductor switching device 23, an overheating detection circuit 22, a semiconductor switch 211, resistors 212 to 214, an auxiliary voltage circuit 215, diodes 216 to 218, and a constant current circuit 219.

The power semiconductor switching device 23 is constituted by an IGBT, for example, in which the collector is connected to one end of a primary winding 31 of the ignition coil 3, the emitter is grounded, and the gate is connected to the external ECU 1 via the resistors 212 and 214 and an input terminal IN. The power semiconductor switching device 23 switches ON and OFF in accordance with a control signal from the ECU 1.

In the present embodiment, when the ECU 1 outputs a 5 V control signal (hereinafter, also referred to as an "ON signal") to the input terminal IN, the power semiconductor switching device 23 receives that voltage at the gate thereof via the resistors 212 and 214 and switches ON, for example. When the power semiconductor switching device 23 switches ON, the collector-emitter path becomes conductive, which allows current (collector current) to flow through the power semiconductor switching device 23 and ultimately results in current flowing through the primary winding 31. On the other hand, when the ECU 1 outputs a control signal of less than 1 V (hereinafter, also referred to as an "OFF signal") to the input terminal IN, the power semiconductor switching device 23 switches OFF. In this case, energy gets stored in a secondary winding 32 of the ignition coil 3, and the terminal voltage of the secondary winding 32 increases. This terminal voltage is then applied to the spark plug 5, in which one end is connected to the secondary winding 32 and the other end is grounded. As a result, the spark plug 5 produces sparks between the electrodes thereof.

Figure 2:
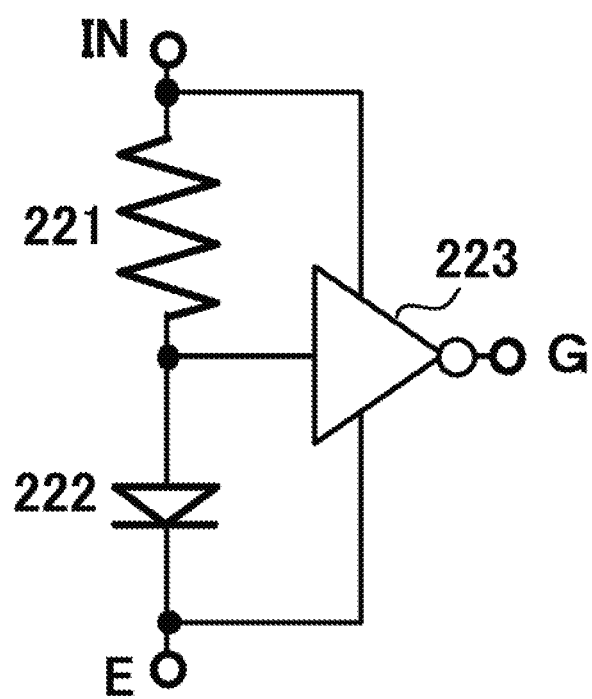
FIG. 2 is a circuit diagram illustrating an example configuration of an overheating detection circuit illustrated in FIG. 1.

As illustrated in FIG. 2, the overheating detection circuit 22 includes a resistor 221, a diode 222, and an inverter 223, for example. The input terminal of the overheating detection circuit 22 is connected to between the resistor 212 and the input terminal IN, and the output terminal is connected to the gate of the semiconductor switch 211. When the operating junction temperature of the power semiconductor switching device 23 becomes greater than or equal to a prescribed threshold value (such as 180° C.), the overheating detection circuit 22 outputs an overheating detection signal to the semiconductor switch 211.

The semiconductor switch 211 is constituted by an N-type MOSFET, for example, in which the drain is connected to between the resistors 212 and 214, the gate is connected to the output terminal of the overheating detection circuit 22, and the source is grounded. The semiconductor switch 211 switches ON upon receiving the overheating detection signal from the overheating detection circuit 22 and pulls down the voltage applied to the gate of the power semiconductor switching device 23. This causes the power semiconductor switching device 23 to switch OFF regardless of the control signal from the ECU 1.

The auxiliary voltage circuit 215 is constituted by a depletion-mode (also known as "normally-on") IGBT, for example. In this IGBT, the collector is connected to the collector of the power semiconductor switching device 23 and to the one end of the primary winding 31 of the ignition coil 3. The gate of this IGBT is connected to the input terminal of the constant current circuit 219 via the diode 216 and the resistor 213, grounded via the diodes 217 and 218, and also fed back into the IGBT's own emitter. Moreover, the diodes 217 and 218 are both Zener diodes, for example, with the diode 218 being connected in the forward direction going from the depletion-mode IGBT to ground and the diode 217 being connected in the reverse direction.

The auxiliary voltage circuit 215 applies, to the gate of the power semiconductor switching device 23, a voltage (hereinafter, also referred to as an "auxiliary voltage") occurring at the emitter of the depletion-mode IGBT due to the collector voltage of the power semiconductor switching device 23. As a result, the current flowing between the collector and emitter of the power semiconductor switching device 23 increases in response to increases in the collector voltage of the power semiconductor switching device 23, thereby ultimately reducing oscillation in the collector voltage of the power semiconductor switching device 23. In other words, the auxiliary voltage circuit 215 is a circuit for reducing oscillation which occurs during the switching operation of the power semiconductor switching device 23.

In the constant current circuit 219, the input terminal is connected via the resistor 213 and the diode 216 to the gate of the IGBT forming the auxiliary voltage circuit 215. Moreover, the diode 216 is a Zener diode, for example, which is connected in the forward direction going from the IGBT of the auxiliary voltage circuit 215 to the constant current circuit 219. Furthermore, the output terminal of the constant current circuit 219 is connected to between the resistors 212 and 214 and is also connected to the drain of the semiconductor switch 211. The constant current circuit 219 is a circuit configured to keep current constant so that if a high-voltage/time-constant surge occurs on the battery 4 side, for example, the auxiliary voltage of the auxiliary voltage circuit 215 onto which this surge gets superimposed is not applied to the gate of the power semiconductor switching device 23. More specifically, the constant current circuit 219 is a circuit which, when a surge occurs, limits the maximum amount of current flowing to the gate of the power semiconductor switching device 23 to the amount of current that can be passed through the semiconductor switch 211 (hereinafter, also referred to as "maximum allowable current").

(Operation)

Next, the operation of the semiconductor device for internal combustion engine ignition as described above will be described in detail.

The power semiconductor switching device 23 switches ON when an ON signal is input to the gate thereof from the external ECU 1 via the input terminal IN and the resistors 212 and 214. Once this happens, collector current Ic begins flowing from the battery 4 to the power semiconductor switching device 23 via the primary winding 31 of the ignition coil 3 and proceeds to increase to a constant value (such as 20).

Next, the power semiconductor switching device 23 switches OFF when an OFF signal is input to the gate thereof from the external ECU 1 via the input terminal IN and the resistors 212 and 214. As a result, the collector current Ic decreases rapidly. This decrease in the collector current Ic causes the terminal voltage of the secondary winding 32 of the ignition coil 3 to increase to several dozen kV (30 kV, for example), and this voltage is applied to the spark plug 5. The spark plug 5 produces sparks between the electrodes thereof when the applied voltage is greater than or equal to approximately 10 kV.

As the power semiconductor switching device 23 repeats this switching operation, the spark plug 5 intermittently produces sparks between the electrodes thereof in response. Here, the auxiliary voltage circuit 215 applies the voltage occurring at the emitter of the depletion-mode IGBT of the auxiliary voltage circuit 215 due to the collector voltage of the power semiconductor switching device 23 to the gate of the power semiconductor switching device 23 as the auxiliary voltage. As a result, the collector current Ic increases in response to increases in the collector voltage of the power semiconductor switching device 23, thereby ultimately reducing oscillations in the collector voltage.

Next, what happens when the operating junction temperature of the power semiconductor switching device 23 increases to a high temperature will be described. If, for example, the terminals of the battery 4 get disconnected for some reason while the battery 4 is being charged by a power generator (not illustrated in the figure) of the internal combustion engine, a high-voltage load dump surge (on the order of 90 V, for example) occurs instantaneously. This load dump surge gets applied to the ignition coil 3. If at this same timing an ON signal is input from the ECU 1 to the gate of the power semiconductor switching device 23, the power semiconductor switching device 23 switches ON at a high wattage, which causes the operating junction temperature to increase to a high temperature. This is because the load dump surge causes the collector voltage of the power semiconductor switching device 23 to increase to a high voltage, thereby resulting in an overvoltage being supplied to the gate of the power semiconductor switching device 23 by the auxiliary voltage circuit 215 via the resistor 214.

When this happens, if the operating junction temperature becomes equal to a prescribed temperature, the divided voltage produced by the resistor 221 and the Zener diode 222 of the overheating detection circuit 22 connected to the gate of the power semiconductor switching device 23 decreases, and the inverter 223 outputs an H-level signal. This H-level signal is input to the gate of the semiconductor switch 211. As a result, the semiconductor switch 211 switches ON, thereby grounding the gate of the power semiconductor switching device 23.

During this operation, the auxiliary voltage circuit 215 supplies an overcurrent resulting from the abovementioned load dump surge to the gate of the power semiconductor switching device 23 via the diode 216 and the resistor 213. This overcurrent typically exceeds the amount of current that can be passed through the semiconductor switch 211. In this case, the gate voltage of the power semiconductor switching device 23 cannot be sufficiently pulled down even if the gate of the power semiconductor switching device 23 is grounded via the semiconductor switch 211 or the like, and therefore the collector current Ic continues flowing. Due to the collector current Ic continuing to flow, the operating junction temperature of the power semiconductor switching device 23 increases, thereby causing the power semiconductor switching device 23 to undergo thermal runaway and suffer damage.

However, in the present embodiment, the constant current circuit 219 is arranged between the auxiliary voltage circuit 215 and the gate of the power semiconductor switching device 23. Here, before overcurrent resulting from a load dump surge gets supplied from the auxiliary voltage circuit 215 to the gate of the power semiconductor switching device 23 via the diode 216 and the resistors 213 and 214, the constant current circuit 219 prevents that overcurrent from being supplied. The constant current circuit 219 limits the magnitude of the overcurrent to the maximum allowable current of the semiconductor switch 211, and therefore the amount of current flowing to the gate of the power semiconductor switching device 23 is limited to the maximum allowable current of the semiconductor switch 211. This makes it possible to pull down the gate voltage of the power semiconductor switching device 23 via the semiconductor switch 211 even when a load dump surge occurs, thereby ultimately making it possible to prevent damage to the power semiconductor switching device 23 due to thermal runaway.

Next, the operations described above will be further described with reference to FIGS. 3 and 4.

Figure 3:
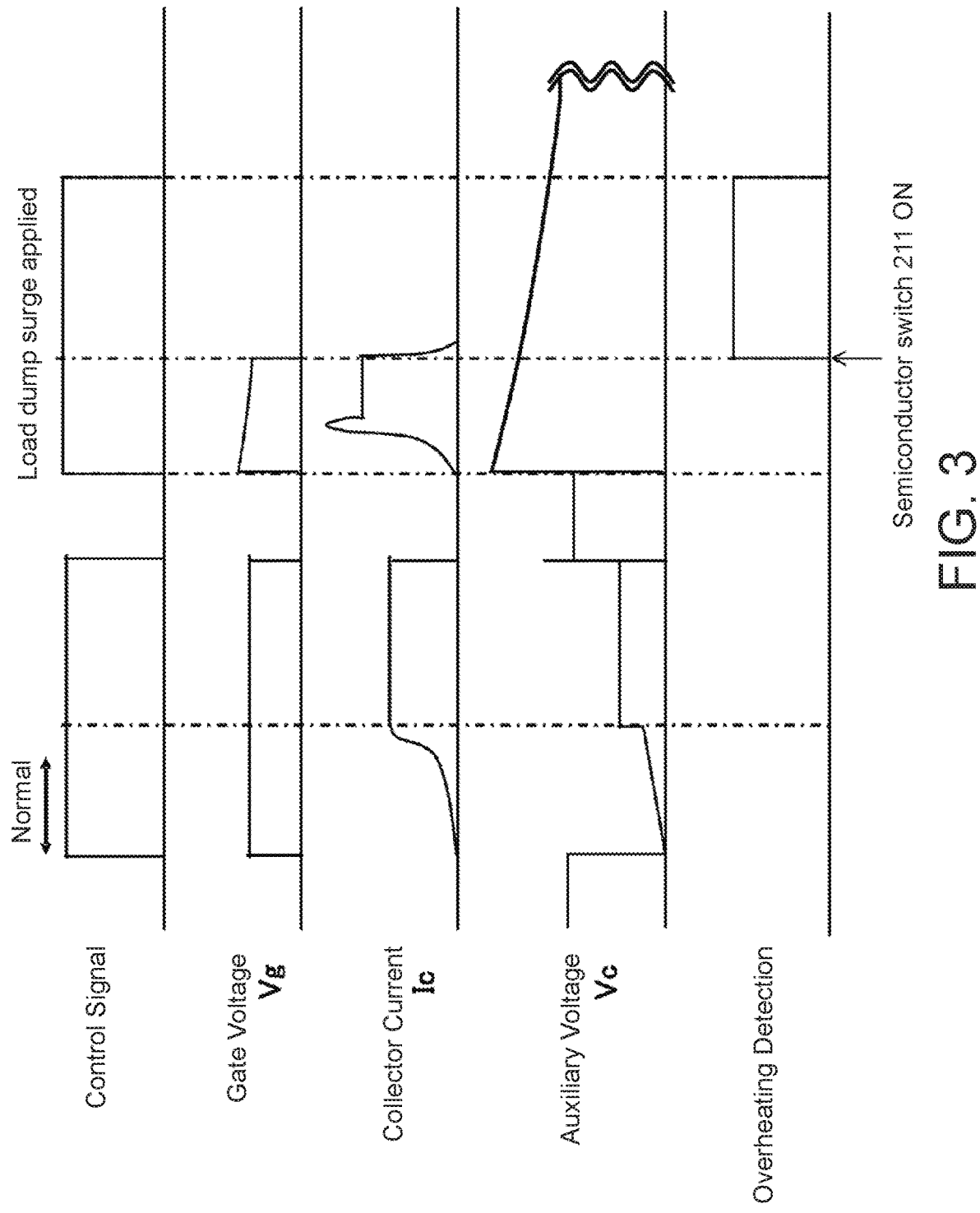
FIG. 3 is a timing chart for explaining the operation of the semiconductor device illustrated in FIG. 1.
Figure 4:
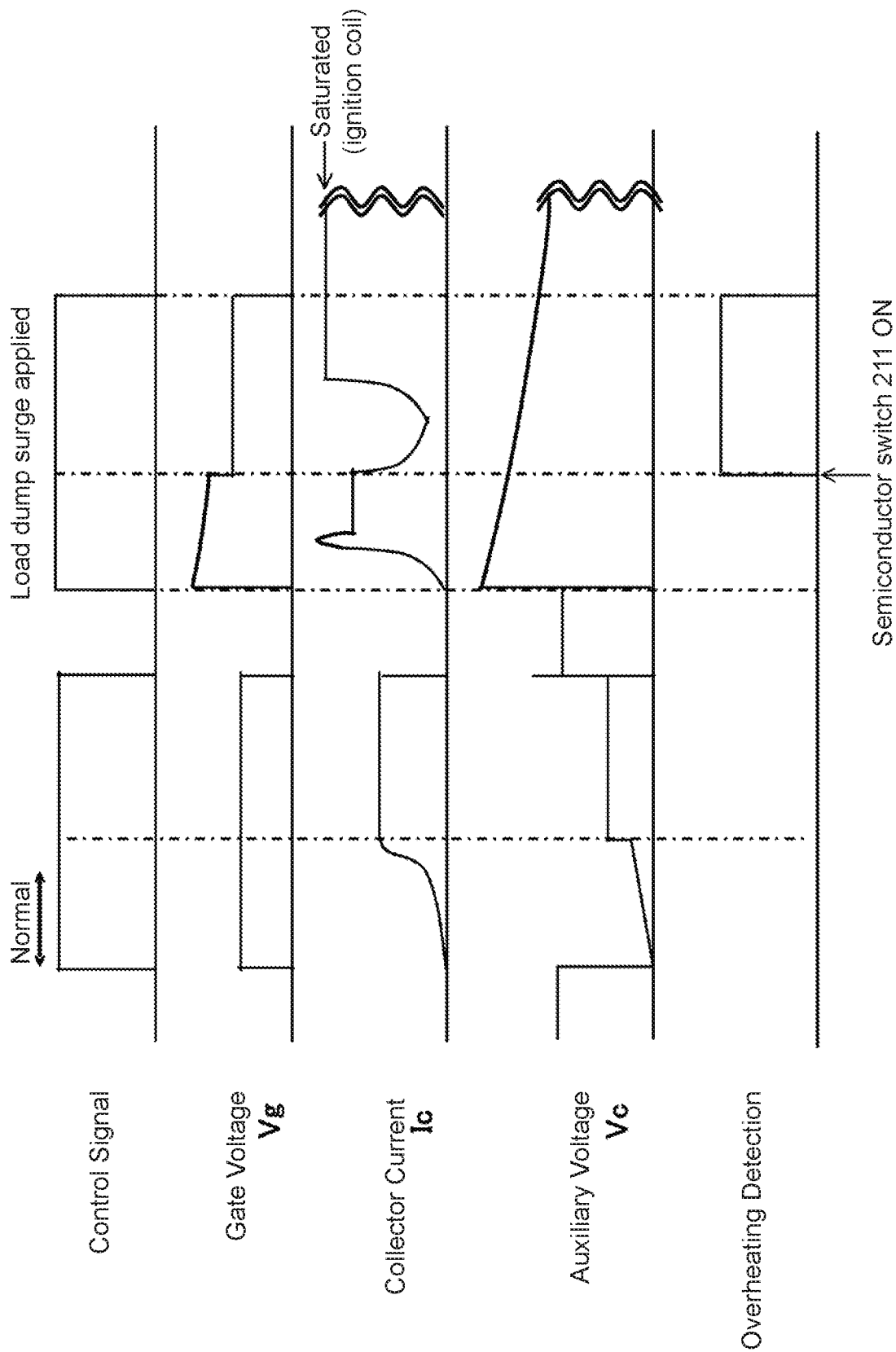
FIG. 4 is a timing chart for explaining the operation of the semiconductor device illustrated in FIG. 1.

First, when a control signal (an ON signal) is input from the ECU 1 to the input terminal IN (see "Control Signal" in FIGS. 3 and 4), a voltage is applied to the gate of the power semiconductor switching device 23 (see "Gate Voltage Vg" in FIGS. 3 and 4), and the collector current Ic of the power semiconductor switching device 23 begins flowing (see "Collector Current Ic" in FIGS. 3 and 4). In this state, if the terminals of the battery 4 get disconnected, a load dump surge occurs. This load dump surge is superimposed onto the auxiliary voltage from the auxiliary voltage circuit 215 (see "Auxiliary Voltage Vc" in FIGS. 3 and 4).

As shown in FIG. 4, if the constant current circuit 219 of the present embodiment is not arranged, even when overheating is detected (see "Overheating Detection") and the semiconductor switch 211 switches ON, the gate voltage Vg cannot be pulled all the way down to 0 V, and the collector current Ic continues flowing until the ignition coil 3 is saturated. Meanwhile, as shown in FIG. 3, by including the constant current circuit 219 of the present embodiment, when overheating is detected and the semiconductor switch 211 switches ON, the amount of current flowing to the gate of the power semiconductor switching device 23 can be limited to the maximum allowable current of the semiconductor switch 211, thereby making it possible to reliably pull down the gate and cut off the collector current Ic flowing through the power semiconductor switching device 23.

Figure 5:
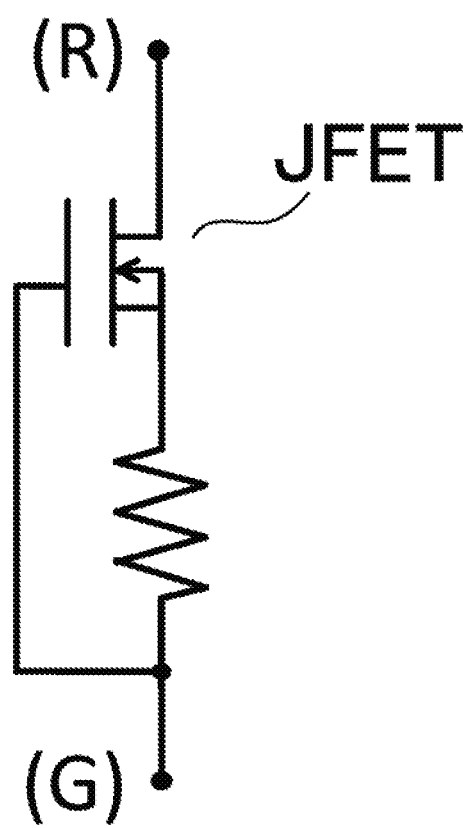
FIG. 5 is a circuit diagram illustrating an example configuration of a constant current circuit illustrated in FIG. 1.
Figure 6A:
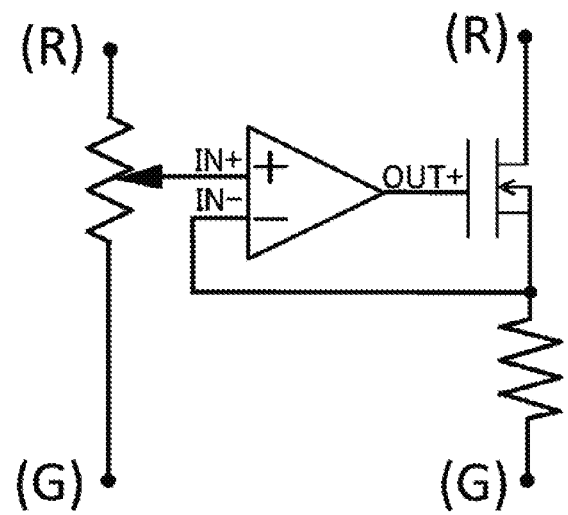
FIGS. 6A and 6B are circuit diagrams illustrating examples of other configurations for the constant current circuit illustrated in FIG. 1.
Figure 6B:
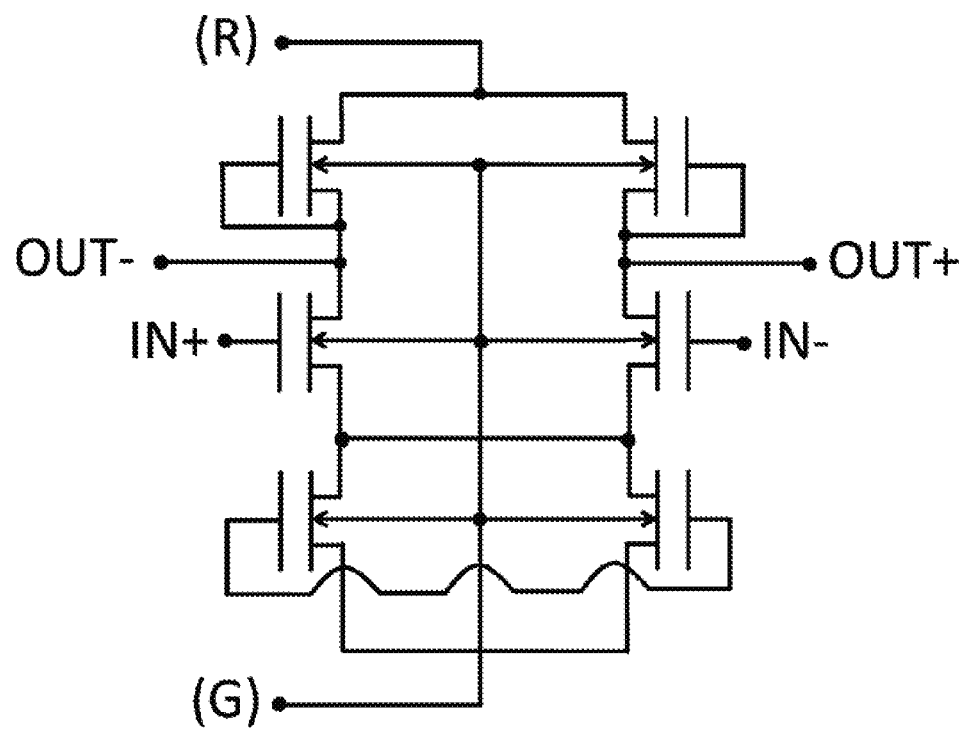

FIGS. 5, 6A and 6B illustrate example configurations of the constant current circuit 219 as described above. As illustrated in FIG. 5, the constant current circuit 219 can be constituted by a junction FET (JFET) and a resistor, for example. Moreover, as illustrated in FIG. 6A, a negative-feedback differential amplifier (op-amp) may be further included. Due to the inclusion of the op-amp as a driver, this configuration, in comparison to the circuit configuration illustrated in FIG. 5, offers advantages such as making it easier to stabilize operation of the constant current circuit 219 and making it possible to change the amount of current as necessary, for example. FIG. 6B illustrates a detailed configuration of such an op-amp.

(Operation and Effects)

In the present embodiment as described above, the semiconductor device 2 for internal combustion engine ignition, which includes the auxiliary voltage circuit 215, has the constant current circuit 219 connected between the auxiliary voltage circuit 215 and the gate of the power semiconductor switching device 23. This prevents overcurrent resulting from high-collector voltage/time-constant surges such as load dump surges from being supplied to the gate of the power semiconductor switching device 23.

Moreover, the constant current circuit 219 makes it possible to limit the magnitude of such overcurrent to the maximum allowable current of the semiconductor switch 211, and therefore when the semiconductor switch 211 switches ON to ground the gate of the power semiconductor switching device 23 in response to detection of overheating, the gate voltage can be reliably pulled down. This makes it possible to reliably switch OFF the power semiconductor switching device 23 even when a load dump surge is applied, thereby making it possible to prevent damage due to thermal runaway.

The present invention is not limited to the embodiment described above, and various applications and modifications can be made without departing from the technical scope of the present invention. Such applications and modifications are also included within the technical scope of the present invention and are similarly included in the technical scope as defined in the claims and their equivalents.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device for internal combustion engine ignition, comprising:

a power semiconductor switching device that switches ON and OFF in accordance with a control signal provided by an external control circuit for causing a spark plug to produce sparks, the power semiconductor switching device including a collector to which a primary winding of an ignition coil is to be connected and a gate to which the control signal is to be inputted;

an auxiliary voltage circuit that generates and applies an auxiliary voltage responsive to a collector voltage of the power semiconductor switching device to the gate of the power semiconductor switching device; and a constant current circuit that is interposed between the auxiliary voltage circuit and the gate of the power semiconductor switching device and that limits current flowing through the constant current circuit from the auxiliary voltage circuit to the gate of the power semiconductor switching device so as to regulate the current even if a high-voltage surge originating from an external power source connected to the primary winding is applied to the auxiliary voltage circuit via the primary winding.

2. The semiconductor device according to claim 1, further comprising:

an overheating detection circuit that detects a temperature of the power semiconductor switching device; and a semiconductor switch connected between the gate of the power semiconductor switching device and ground, the semiconductor switch switching ON upon receiving an overheating detection signal from the overheating detection circuit so as to ground the gate of the power semiconductor switching device.

3. The semiconductor device according to claim 2, wherein the constant current circuit limits the current flowing from the auxiliary voltage circuit to the gate of the power semiconductor switching device to less than a maximum allowable current prescribed for the semiconductor switch.

4. The semiconductor device according to claim 2, wherein the overheating detection circuit includes a diode for detecting the temperature of the power semiconductor switching device and an inverter for outputting the overheating detection signal.

5. The semiconductor device according to claim 1, wherein the auxiliary voltage circuit includes a normally-on power semiconductor device.

6. The semiconductor device according to claim 1, wherein the constant current circuit includes a power semiconductor device and a negative-feedback differential amplifier that has an output terminal connected to the gate of the power semiconductor device.

7. The semiconductor device according to claim 1, wherein the semiconductor device is formed on a single chip.

* * * * *